United States Patent [19]
Takamuku et al.

[11] Patent Number: 5,369,090
[45] Date of Patent: Nov. 29, 1994

[54] PROCESS FOR PRODUCING BI-BASED OXIDE SUPERCONDUCTOR SINGLE CRYSTALS

[75] Inventors: Kenshi Takamuku, Chiba, Japan; Genda Gu, New South Wales, Australia; Naoki Koshizuka, Chiba, Japan

[73] Assignee: International Superconductivity Technology Center, Tokyo, Japan

[21] Appl. No.: 46,975

[22] Filed: Apr. 15, 1993

[30] Foreign Application Priority Data

Apr. 15, 1992 [JP] Japan .................. 4-122709

[51] Int. Cl.$^5$ ............................................. C30B 13/20
[52] U.S. Cl. ................................... 505/451; 117/49
[58] Field of Search ................... 505/1, 729, 782; 156/60.2

[56] References Cited

U.S. PATENT DOCUMENTS

| | | | |
|---|---|---|---|
| 5,015,618 | 5/1991 | Levinson | 156/610 |
| 5,057,492 | 10/1991 | Oka et al. | 505/729 |
| 5,162,300 | 11/1992 | Bock et al. | 505/782 |

FOREIGN PATENT DOCUMENTS

| | | | |
|---|---|---|---|
| 03159988 | 7/1991 | Japan | 505/729 |
| 3174327 | 7/1991 | Japan | 505/729 |
| 03279287 | 12/1991 | Japan | 505/1 |

OTHER PUBLICATIONS

Motehira et al. "Single Crystal Growth of Bismuth Calcium Strontium Cuprate ($Bi_2Sr_2Ca_{n-1}Cu_nO_y$) by the Floating Zone Method", Nippon Seramikkusu Kyokai Gakujutsu Ronbunshi, 97(10) 1009-14 (abs only) 1989.

Takekawa et al, "Single Crystal Growth of the Superconductor $Bi_2(Bi_{0.2}Sr_{1.8}Ca_1)(Cu_2O_8$ Journal of Crystal Growth", vol. 92 (1986) pp. 687–690.

*Primary Examiner*—Robert Kunemund
*Attorney, Agent, or Firm*—Wegner, Cantor, Mueller & Player

[57] ABSTRACT

A process for producing Bi-based oxide superconductor single crystals by the floating zone method is disclosed, which comprises using a feed rod of an oxide comprising a formulation of metallic elements represented by the following general formula:

$$Bi_pSr_qCa_rCu_2O_y$$

wherein $$2.00 < p < 2.18,\ 1.87 < q < 2.00,\ 0.9 \leq r \leq 1.0,$$

and y is a positive number, in a moving rate of said rod of from 0.1 to 0.35 mm per hour in the side where crystals are accumulated, in which preferably, in the initial stage of the formation of crystals, the diameters of the rod-like crystals to be accumulated are changed in the wavelike state, and more preferably, in the middle stage of the subsequent formation of crystals, the amount of change thereof is gradually decreased. According to the present invention, the deposition of different phases which inhibit the growth of crystals and the formation of fine pores can be eliminated, and the constitutional supercooling during the growth of crystals can be avoided. Therefore, large-size Bi-based oxide superconductor single crystals having a good quality can be produced.

7 Claims, 4 Drawing Sheets

PROCESS FOR PRODUCING BI-BASED OXIDE SUPERCONDUCTOR SINGLE CRYSTALS

FIELD OF THE INVENTION

The present invention relates to a process for producing Bi-based oxide superconductor single crystals and specifically relates to a process for producing Bi-based oxide superconductor single crystals from which large single crystals are obtained by the floating zone method.

BACKGROUND OF THE INVENTION

As the process for producing Bi-based oxide superconductor single crystals, there are known the flux method using a crucible, the floating zone method (hereinafter referred to as the FZ method), and the like. In the flux method, a self flux, a KCl flux, etc. are used as the flux. However, this method involved such problems that (1) the quality of crystals is lowered by contamination from the crucible, leading to a reduction in the superconducting properties and that (2) not only works for separating the flux are required which take plenty of time, but also the crystals to be obtained are so fine that the thickness in the c axis direction is approximately from 0.1 to 0.2 mm.

On the other hand, there is an attempt to increase the thickness in the c axis direction by the FZ method. In this FZ method, two rod-like specimens of polycrystal (feed rods) are vertically supported up and down, the both are made appropriately come near, seed crystals are arbitrarily placed in a gap therebetween, one end of each of the feed rods is heat melted to form a narrow melting zone therebetween, and the resulting feed rods are moved in one direction while being revolved, to grow single crystals.

For example, at this time, by using feed rods which have been subjected to a high-speed melt-passing processing such that the feed rods are dense and that the growth is rendered stable, to have a formulation ratio of metallic elements of Bi/Sr/Ca/Cu of 2.2/1.8/1.0/2.0, the growth is carried out at a rate of 0.5 mm/hr in an atmosphere at an oxygen partial pressure of 22 KPa, to form single crystals having a maximum value of 50×5×2 mm [e.g. see Teion Kogaku (Low-Temperature Engineering), Vol. 25, No. 5 (1990), pp. 18–24].

Also, by using feed rods prepared so as to have a formulation of metallic elements of $Bi_{2.2}Sr_xCa_yCu_{2.0}$, wherein x and y are each a positive number and x/y of 1.5~0.9, the growth is carried out at a rate of 0.5 mm/hr in the atmosphere, to form single crystals having a thickness in the c axis direction of 4 mm (see JP-A-Hei. 3-279287).

However, the single crystals obtained by the above-described FZ method are so inferior with respect to the crystallinity that different phases or fine pores, or cracks, etc. are found in the particles. Accordingly, these single crystals are not suitable as large-size single crystals having a good quality to be required as single crystals for the measurement of generally precise physical properties or of an anisotropic effect, etc.

SUMMARY OF THE INVENTION

An object of the present invention is to provide a process in which large-size Bi-based oxide superconductor single crystals having a good quality can be produced.

The present inventors have made extensive and intensive investigations. As a result, it has now been found that the above-described object can be attained by the FZ method in which the crystal growth is carried out at a specific rate, while using an oxide having a specific formulation of metallic elements as the feed rod, leading to accomplishment of the present invention.

That is, the process for producing Bi-based oxide superconductor single crystals according to the present invention is a process for producing Bi-based oxide superconductor single crystals by the floating zone method and comprises using a feed rod of an oxide comprising a formulation of metallic elements represented by the following general formula:

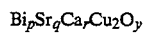

wherein $$2.00 < p < 2.18, 1.87 < q < 2.00, 0.9 \leq r \leq 1.0,$$

and y is a positive number, in a moving rate of said rod of from 0.1 to 0.35 mm per hour in the side where crystals are accumulated. Preferably, in the initial stage of the formation of crystals, the diameters of the rod-like crystals to be accumulated are changed in the wavelike state, and more preferably, in the middle stage of the subsequent formation of crystals, the amount of change thereof is gradually decreased.

According to the process of the present invention, since an oxide comprising a specific formulation of metallic elements is used as the raw material, the deposition of different phases and the formation of fine cells, which unlikely make the crystal large in size at the time of formation, and the like can be eliminated.

Also, since the moving rate of the feed rod is made slow, the constitutional supercooling during the growth of crystals can be avoided, and the quality of crystals can be made good.

BRIEF DESCRIPTION OF THE ACCOMPANYING DRAWINGS

DETAILED DESCRIPTION OF THE INVENTION

Figure 1:
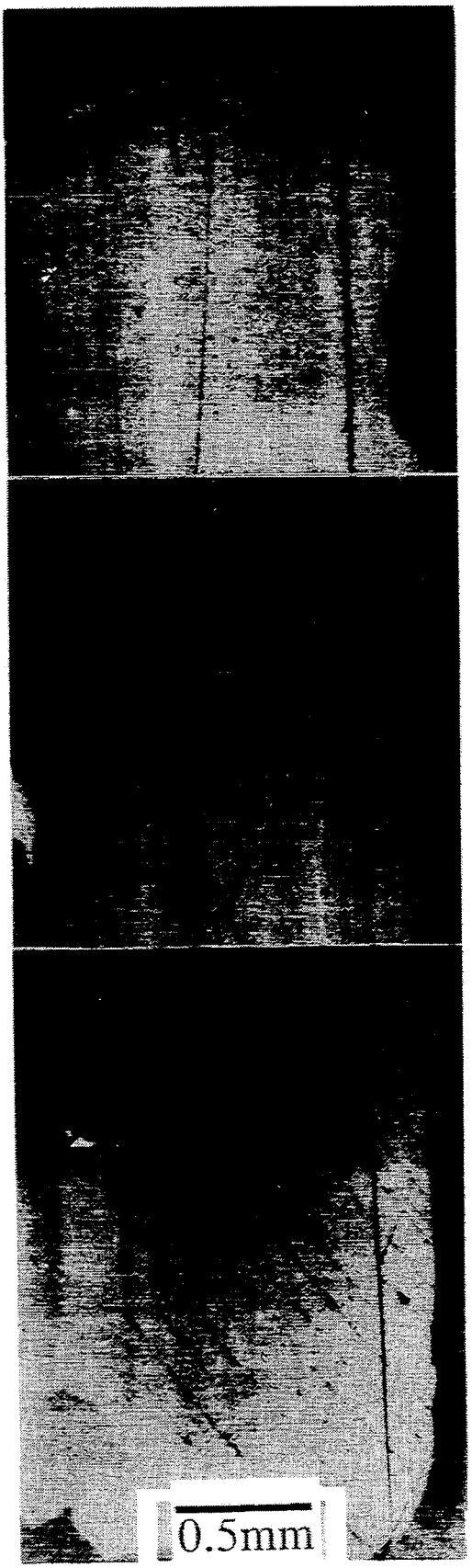
FIG. 1 is a polarizing microscopic photograph in the vertical cross-section in the growth direction of the Bi-based oxide superconductor growing rod obtained in one working example of the present invention.

The present invention will be hereunder explained in more detail.

The present invention comprises using, as a feed rod, an oxide comprising a formulation of metallic elements represented by the following general formula:

wherein $2.00 < p < 2.18, 1.87 < q < 2.00, 0.9 \leq r \leq 1.0$, and y is a positive number, In order to eliminate the formation of different phases which inhibit the growth of crystals, the generation of fine pores or cracks in the crystal, and the like, the formation of metallic elements is specified as described above. If the formulation is outside the above-described range, it is difficult to grow the single crystal in a large size and, hence, such is not desired.

The Bi-based oxide superconductor which is used as the above-described feed rod is produced in the following manner.

Raw materials containing the respective metallic elements are processed by known methods such as the solid phase reaction method and the coprecipitation method, to obtain a raw material powder having the above-described formulation. Though a mixture obtained by arbitrarily pulverizing the respective raw materials in a micron order or sub-micron order in an appropriate means and mixing them in a predetermined ratio may be used, it is preferred to use a synthetic powder produced by the known coprecipitation method and particularly, a fine powder having a mean particle size of from approximately 0.05 to 1.0 $\mu$m.

Subsequently, the above-described raw material powder is tentatively molded in a pellet-like state or the like as it stands or under an elevated pressure and then calcined. The calcination is carried out for the purposes of uniformly mixing the respective components in a molecular level by the reaction and diffusion to eliminate other elements than the constituent elements of the Bi-based oxide superconductor. The temperature is appropriately determined depending on the kind and blending proportion of the raw material powder to be used and is usually 750° C. or higher, preferably from 750° to 850° C., and particularly about 800° C. While the calcination time varies depending on the temperature, the calcination is usually carried out for from 2 to 40 hours or more, and preferably about one week. It is preferred that the calcination time is as long as possible within this range.

Thereafter, the calcined material is again pulverized to obtain a calcined material fine powder having a mean particle size of from approximately 0.1 to 2 $\mu$m. The thus obtained calcined material fine powder is molded in a rod-like state, which is then sintered. The sintering is carried out at a temperature of 800° C. or higher, preferably from 820° to 890° C., and the best range thereof being from 860° to 880° C. Other conditions are the same as those for the calcination as described above.

Moreover, if desired, the above-described sintered rod-like material is subjected to a high-speed melt-passing processing. Alternatively, the calcined material fine powder is directly melted and quenched. Thus, the feed rod is made high in density.

In the present invention, as the heating method of the feed rod, high-frequency induction heating, resistance heating, infrared heating, laser heating, electron beam heating, etc. can be employed.

Also, the present invention is characterized in that in the case of formation of single crystals, the moving rate of the above-described feed rod is set up at from 0.1 to 0.35 mm/hr.

In order to avoid the constitutional super-cooling during the growth of crystals thereby making the quality of the crystals good, the moving rate is specified in the above-described range. If the moving rate is too fast, the formed crystals become inhomogeneous in quality, i.e., different phases or fine pores are present in the crystal particles, and, hence, such is not preferred.

In addition, the present invention is characterized in that in the initial stage of the formation of crystals, the diameters of the rod-like crystals to be accumulated are changed in the wavelike state and that thereafter, in the middle stage of the formation of crystals, the amount of change thereof is gradually decreased.

In more detail, that the diameters of the rod-like crystals to be accumulated are changed in the wavelike state means that the external part of the cross-section of the rod-like crystal in the longitudinal direction becomes into the wavelike state where the major axis and the minor axis are continuously repeated, and such is realized in the following manner.

(1) The relative rate of the feed side to the crystal formation side is changed.

(2) The amount of heat to be fed into the melting zone is changed. That is, (a) the amount of electric power to be supplied is changed; (b) the degree of condensation is changed; (c) if the heating means is laser heating, its wavelength is changed; and (d) if the heating means is electron beam heating, its beam diameter is changed.

(3) The numbers of revolution of the up and down rods are changed.

(4) The atmosphere is changed.

Using any one of the above-described methods (1) to (4), the operation wherein the diameters of the formed crystals are once decreased and then again increased is alternately repeated at least one time. The cycle of this operation is suitably from several hours to one week.

One specific example of the above-described operation will be given below. The method (1) is carried out in such a manner that the moving rate of the feed rod to be fed is delayed by from 0.01 to 0.1 mm/hr, and preferably from 0.01 to 0.05 mm/hr as compared with the moving rate of the formed crystal rod, the rate is gradually decreased over from several hours to one week, the rate is returned to the original rate, and the same operation is repeated several times.

In the above-described method (2)-(a), the operation wherein the current amount to be supplied to the lamp is decreased from 0.1 to 1.0% of the initial value and then increased is carried out in a cycle of from several hours to one week, and the same operation is repeated several times.

The above-described methods may be carried out either singly or in combination at the same time. By this operation, the diameters of the rod-like crystals to be accumulated are changed, only the crystals which are oriented in the direction where the crystals readily grow are remained, and the nucleus formation or deposition of small crystals can be controlled. Therefore, such is preferred.

Furthermore, what in the middle stage of the formation of crystals, the amount of the change is gradually decreased means that, for example, the width of the operation of the means for causing the change in the above-described initial stage is rendered small, or the means for causing a plurality of changes in the above-described initial stage are carried out while decreasing the number thereof.

One specific example of the above-described operation will be given below. Though in the initial stage, the change of the relative rate of the feed side to the crystal formation side is set up at 0.05 mm/hr, in the middle stage, it is set up at 0.02 mm/hr. Alternatively, though in the initial stage, the above-described methods (1) and (2) are employed in combination, in the middle stage, only the method (2) is employed.

By the above-described operation, the nucleus formation or deposition of small crystals can be controlled in the middle stage, and the crystals can be further grown. Therefore, such is preferred.

If the above-described operation is employed in combination with the method for specifying the moving rate of the feed rod as described above, large-size single crystals with a better quality can be formed and, hence, such is preferred.

In the FZ method which is applied in the present invention, known apparatus can be used. For example, the apparatus described in, e.g., JP-A-Hei. 3-279287 as cited above, and the like can be suitably used.

The present invention will be more specifically described below with reference to the Examples. As a matter of course, it should not be construed that the present invention is limited thereto.

EXAMPLE 1

Preparation of Feed Rod $Bi_2O_3$, $SrCO_3$, $CaCO_3$, and $CuO$ were weighed in an agate mortar so as to have a formation of metallic elements of Bi/Sr/Ca/Cu of 2.1/1.9/1/2 (by mole) and thoroughly mixed. The mixture was charged in an alumina crucible and calcined in air at 800° C. The thus obtained powder was pulverized and mixed. The mixture was charged in a rubber hose and pressure molded in a cold hydrostatic compressor to form a round rod-like material having a diameter of about 9.5 mm and a length of 150 mm. The round rod-like material was sintered at 840° to 850° C. for 3 days and subjected to a high-speed melt-passing processing at a rate of 25 mm/hr by an optical floating zone melter (manufactured by Ascal Corp.), to prepare a feed rod.

Formation of Bi-Based Oxide Superconductor Single Crystals

The above-described raw material was installed in each of up and down revolution axes of the above-described apparatus, and a solvent comprising Bi/Sr/Ca/Cu of 2.5/1.9/1.0/2.6 (by mole) was placed between the two feed rods. The solvent as used was one prepared by calcination, molding and sintering.

Thereafter, the solvent was heat melted, and the up and down rods were adhered thereto. The up and down rods were moved in the atmosphere at a rate of 0.2 mm/hr while revolving the up and down revolution axes at 36 rpm and 30 rpm, respectively, to grow single crystals of $Bi_{2.1}Sr_{1.9}Ca_{1.0}Cu_{2.0}Oy$.

Observation of Bi-Based Oxide Superconductor Single Crystals

The above-described feed rod having single crystals grown was cut in round slices and observed for the size and structure of the crystal particle of single crystals by a polarizing microscope, and the single crystals were taken out. As a result, the Bi-based oxide superconductor single crystals were of a large size having a size of 2 mm×5 mm or more in the a and b directions and a thickness of 1 mm in the c axis direction. Also, the crystals were so good in quality that the formation of different phases, fine pores, or cracks was not substantially found.

EXAMPLE 2

The same procedures as in Example 1 were repeated, except for changing them in the following manner. That is, in the initial stage of the formation of crystals, the descent rate of the feed rods to be fed was decreased from 0.19 mm/hr to 0.15 mm/hr, and the current amount to be supplied to the lamp was gradually increased by about 0.3% to decrease the diameter of the grown rod. Thereafter, the descent rate was returned to 0.19 mm/hr, and the current amount to be supplied was again increased by about 0.3% to increase the diameter of the grown rod. This operation was repeated three times over 5 days. Then, the descent rate of the feed rods to be fed was fixed at 0.15 mm/hr, and the above-described increase and decrease of the amount of electric power to be supplied were repeated four times over 10 days, to grow single crystals.

Observation of Bi-Based Oxide Superconductor Single Crystals

Figure 2:
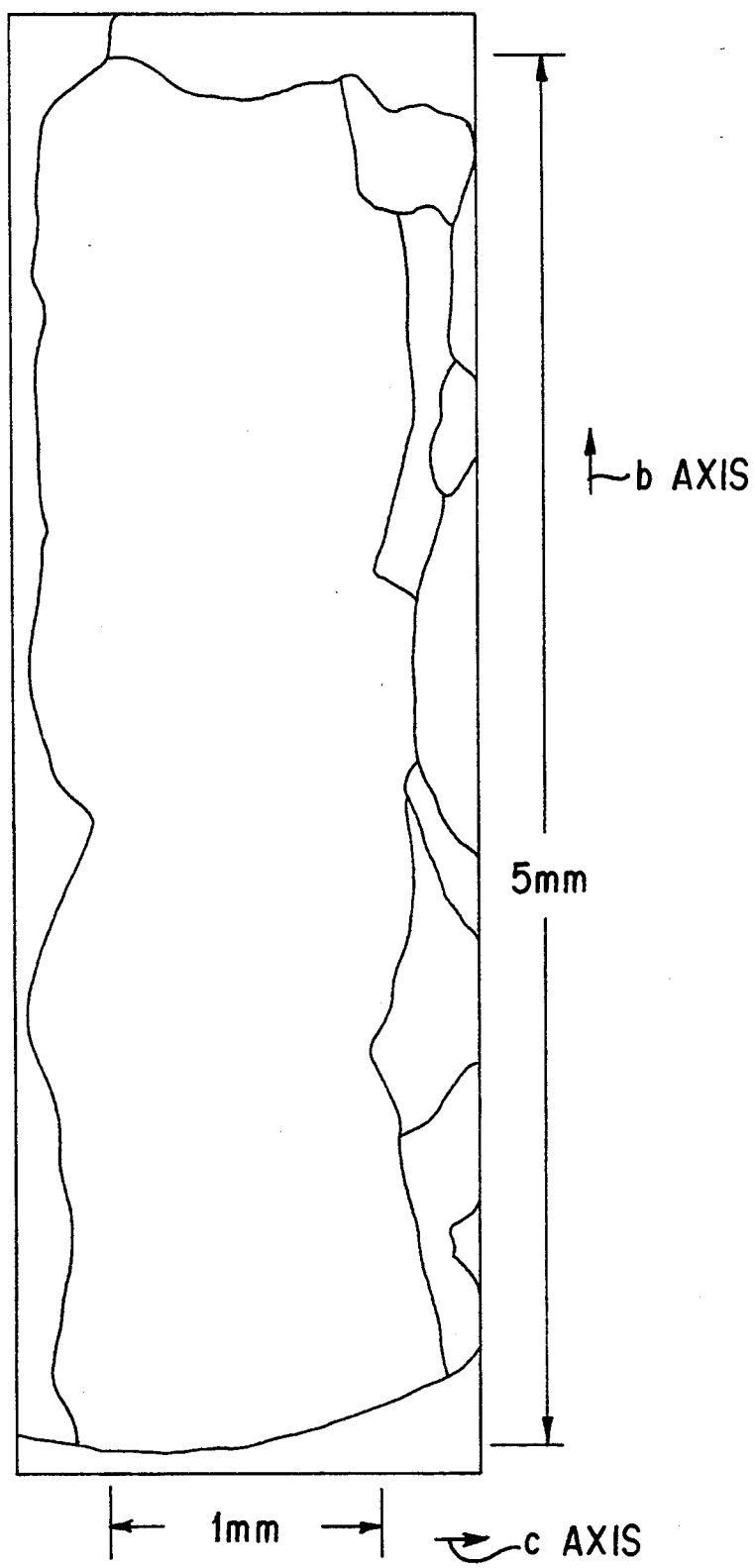
FIG. 2 is an illustrative view of the polarizing microscopic photograph of FIG. 1.
Figure 3A:
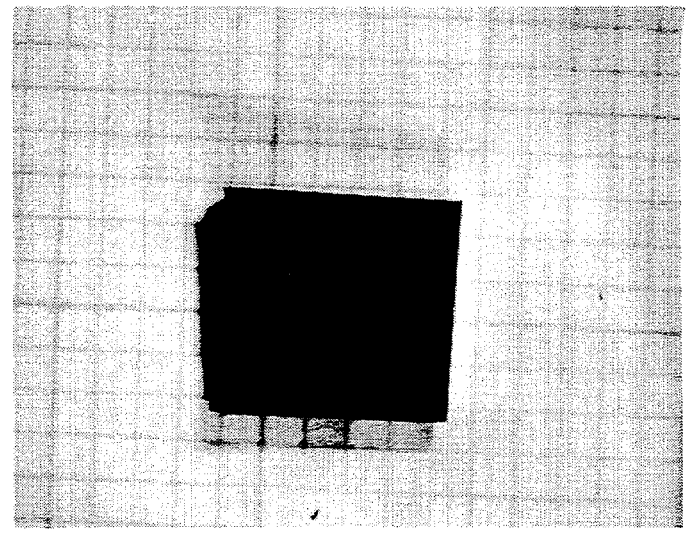
FIG. 3 is a microscopic photograph to show the appearance and size of the Bi-based oxide superconductor single crystal obtained in one working example of the present invention, wherein (a) is the a-b plane, and (b) is the b-c plane.
Figure 3B:
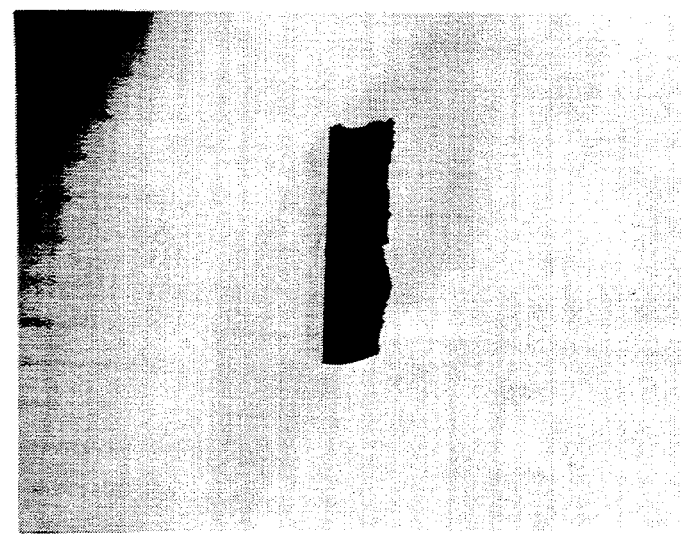
Figure 4:
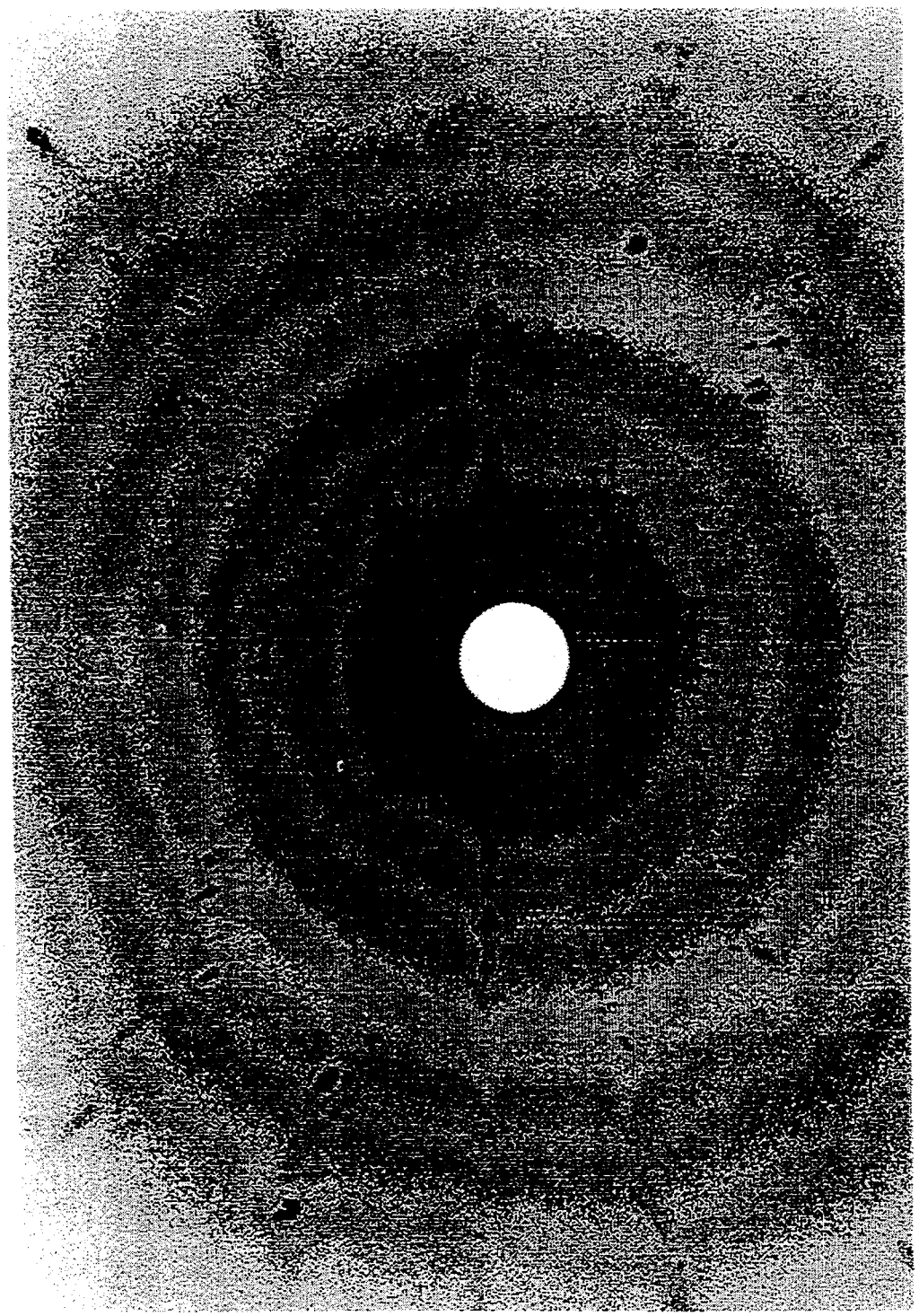
FIG. 4 is a drawing to show a Laue pattern of the a-b plane of the Bi-based oxide superconductor single crystal obtained in one working example of the present invention.

The above-described feed rod having single crystals grown was observed and measured for the size of the crystal particle of single crystals in the same manner as in Example 1. As a result, as is clear from FIG. 1 which is a cross-sectional polarizing microscopic photograph as well as FIG. 2 to show its illustrative view, the single crystals had a thickness of 1 mm in the c axis direction and were so good in quality that the formation of different phases, fine pores, or cracks was not all found. Also, when the single crystals were taken out, as shown in FIG. 3(a), the size was 5 mm×5 mm or more in the a and b directions, as shown in FIG. 3(b), the thickness was 1 mm in the c axis direction. Further, it was confirmed from a Laue X-ray photograph of the a-b plane of the crystal as shown in FIG. 4 that this crystal was a single crystal.

COMPARATIVE EXAMPLE 1

Bi-based oxide superconductor single crystals were formed in the same manner as in the formation of Bi-based oxide superconductor single crystals of Example 1, except that the formulation of metallic elements of the feed rod and the moving rate were changed as shown in Table 1. The size and crystal state of the formed single crystals are shown in Table 1.

TABLE 1

| | Formulation of metallic elements of feed rod | | | | Moving rate in the side of crystal to be formed |
|---|---|---|---|---|---|
| | Bi | Sr | Ca | Cu | (mm/hr) |
| Ex. 1 | 2.1 | 1.9 | 1.0 | 2.0 | 0.2 |
| Comp. Ex. 1 | 2.2 | 1.8 | 1.0 | 2.0 | 0.5 |
| Comp. Ex. 2 | 2.2 | 1.8 | 1.0 | 2.0 | 0.2 |
| Comp. Ex. 3 | 2.19 | 1.76 | 0.97 | 1.95 | 0.2 |
| Comp. Ex. 4 | 2.18 | 1.87 | 0.99 | 1.97 | 0.2 |

| | Bi-Based oxide superconductor single crystal (mm) | | | State of Crystal | | |
|---|---|---|---|---|---|---|
| | a Axis | b Axis | c Axis | Formation of different phases | Fine pores | Cracks |
| Ex. 1 | 2.0 | 5.0 | 1.0 | not substantially found | not substantially found | not substantially found |
| Comp. | 1.0– | 1.0– | 0.1 | found | found | found |

TABLE 1-continued

| | | | | | | |
|---|---|---|---|---|---|---|
| Ex. 1 | 1.5 | 1.5 | | | | |
| Comp. Ex. 2 | 1.0 | 2.0–3.0 | 0.2 | found | found | not substantially found |
| Comp. Ex. 3 | 1.0–1.5 | 2.0–4.0 | 0.3 | found | not substantially found | not substantially found |
| Comp. Ex. 4 | 1.0 | 1.0–1.5 | 0.4 | not substantially found | not substantially found | not substantially found |

As is clear from Table 1, the single crystals obtained in each of the Comparative Examples had a length as short as from 0.1 to 0.4 mm in the c axis direction and were so inferior in quality that the formation of different phases, fine pores, or cracks was found in the crystal particle.

As have described in detail, according to the present invention, the deposition of different phases which inhibit the growth of crystals and the formation fine pores can be eliminated, and the constitutional supercooling during the growth of crystals can be avoided. Therefore, large-size Bi-based oxide superconductor single crystals having a goods quality can be produced.

While the invention has been described in detail and with reference to specific embodiments thereof, it will be apparant to one skilled in the art that various changes and modifications can be made therein without departing from the spirit and scope thereof.

What is claimed is:

1. A process for producing Bi-based oxide superconductor single crystals by the floating zone method, which comprises using a feed rod of an oxide comprising a formulation of metallic elements represented by the following general formula $$Bi_pSr_qCa_rCu_2O_y$$

wherein $2.00 < p < 2.18$, $1.87 < q < 2.00$, $0.9 \leq r \leq 1.0$, and y is a positive number, in a moving rate of said rod of from 0.1 to 0.35 mm per hour on the side where crystals are accumulated.

2. A process for producing Bi-based oxide superconductor single crystals by the floating zone method, which comprises using a feed rod of an oxide comprising a formulation of metallic elements represented by the following general formula:

$$Bi_pSr_qCa_rCu_2O_y$$

wherein $2.00 < p < 2.18$, $1.87 < q < 2.00$, $0.9 \leq r \leq 1.0$, and y is a positive number, in a moving rate of said rod of from 0.1 to 0.35 mm per hour in the side where crystals are accumulated, wherein in the initial stage of the formation of crystals, the diameters of the rod-like crystals to be accumulated are changed in the wavelike state.

3. A process for producing Bi-based oxide superconductor single crystals by the floating zone method, which comprises using a feed rod of an oxide comprising a formulation of metallic elements represented by the following general formula:

$$Bi_pSr_qCa_rCu_2O_y$$

wherein $2.00 < p < 2.18$, $1.87 < q < 2.00$, $0.9 \leq r \leq 1.0$, and y is a positive number, in a moving rate of said rod of from 0.1 to 0.35 mm per hour in the side where crystals are accumulated, wherein in the initial stage of the formation of crystals, the diameters of the rod-like crystals to be accumulated are changed in the wavelike state, and thereafter, in the middle stage of the formation of crystals, the amount of change thereof is gradually decreased.

4. A process of producing Bi-based oxide superconductor single crystals as claimed in claim 2, wherein the change of the diameters of the rod-like crystals to be accumulated is made by changing the feed rate of the feed rod to be fed and/or the amount of heat to be fed into the melting zone.

5. A process for producing Bi-based oxide superconductor single crystals as claimed in claim 3, wherein in the middle stage of the formation of crystals, the gradual decrease of the amount of change in the initial stage is made by changing the amount of heat to be fed into the melting zone, while fixing the feed rate of the feed rod to be fed.

6. A process of producing Bi-based oxide superconductor single crystals as claimed in claim 3, wherein the change of the diameters of the rod-like crystals to be accumulated is made by changing the feed rate of the feed rod to be fed and/or the amount of heat to be fed into the melting zone.

7. A process for producing Bi-based oxide superconductor single crystals by the floating zone method according to claim 1, wherein the single crystal produced is $Bi_{2.1}Sr_{1.9}Ca_{1.0}Cu_{2.0}O_y$.

* * * * *